US008532220B2

United States Patent
Lu et al.

(10) Patent No.: US 8,532,220 B2
(45) Date of Patent: Sep. 10, 2013

(54) METHODS AND APPARATUS FOR SECURE DISTRIBUTION AND STORAGE OF DATA USING N CHANNELS

(75) Inventors: Ligang Lu, New York, NY (US); Ashish Jagmohan, White Plains, NY (US); Dake He, Ontario (CA)

(73) Assignee: International Business Machines Corporation, Armonk, NY (US)

( * ) Notice: Subject to any disclaimer, the term of this patent is extended or adjusted under 35 U.S.C. 154(b) by 647 days.

(21) Appl. No.: 12/712,740

(22) Filed: Feb. 25, 2010

(65) Prior Publication Data

US 2011/0206145 A1  Aug. 25, 2011

(51) Int. Cl.
*H04L 27/00* (2006.01)
(52) U.S. Cl.
USPC ........... 375/295; 375/246; 375/253; 375/316; 375/341
(58) Field of Classification Search
USPC .......................... 375/295, 246, 253, 316, 341
See application file for complete search history.

(56) References Cited

U.S. PATENT DOCUMENTS

| | | | |
|---|---|---|---|
| 2006/0200724 A1 | 9/2006 | Stankovic et al. | |
| 2008/0106443 A1* | 5/2008 | Liu et al. | ........................ 341/56 |
| 2008/0189073 A1* | 8/2008 | Jagmohan et al. | ............ 702/181 |
| 2008/0320363 A1 | 12/2008 | He et al. | |
| 2009/0030922 A1* | 1/2009 | Chen et al. | .................... 707/101 |

OTHER PUBLICATIONS

Johnson et al., "On Compressing Encrypted Data Without the Encryption Key," Department of Electrical Engineering and Computer Sciences, University of CA.
Draper et al., "Secure Storage of Fingerprint Biometrics Using Slepian-Wolf Codes", Mitsubishi Electric Research Lab., 2007.

* cited by examiner

*Primary Examiner* — Kabir A Timory
(74) *Attorney, Agent, or Firm* — Ryan, Mason & Lewis, LLP

(57) ABSTRACT

Methods and apparatus are provided for secure distribution and storage of data using N channels. An input data sequence, X, is distributed using a plurality, N, of channels. In one embodiment, the input data sequence, X, is split into N subsequences; and the N subsequences are encoded into N bit streams using a set of Slepian-Wolf codes with N separate encoders and a joint decoder. The Slepian-Wolf codes can be selected to ensure a computational complexity to obtain a portion of the input data sequence grows exponentially with respect to a length of the input data sequence unless all of the N bit streams are compromised. In another embodiment, the input data sequence, X, is compressed using a lossless data compressing techniques; and the compressed input data sequence is split into N subsequences that are distributed.

22 Claims, 4 Drawing Sheets

METHODS AND APPARATUS FOR SECURE DISTRIBUTION AND STORAGE OF DATA USING N CHANNELS

FIELD OF THE INVENTION

The present invention relates generally to the electrical, electronic and computer arts, and, more particularly, to the storage and distribution of data.

BACKGROUND OF THE INVENTION

A number of technical challenges are encountered when transmitting data over communication channel(s). First, it is important that the bandwidth of the communication channel(s) is efficiently utilized. In addition, it is important that the data is protected against unintended or unauthorized access. Traditionally, these two challenges are addressed independently, using compression and encryption techniques, respectively. For example, when the data must be fully recovered by the intended recipient(s), it can be compressed using lossless compression algorithms, such as Huffman codes or Lempel-Ziv algorithms, and then encrypted using private key-based ciphers based on the DES (Data Encryption Standard) or AES (Advanced Encryption Standard) standards, or public key-based ciphers, such as those based on RSA encryption techniques.

If only one communication channel is used, a successful attack to obtain the encryption key will compromise the data completely. Thus, one would like to reduce the risk by using multiple communication channels to transmit the data. For example, if there are N communication channels available, the data can be broken into N parts, each of which is compressed and encrypted before transmission through one of the N channels. Thus, the attacker must break the encryption ciphers used in all N channels before compromising the data completely. However, with each cipher broken, the attacker learns at least part of the data. This partial security breach is still undesirable especially when the data is highly sensitive (for example, private information such as social security numbers).

When data security is of particular importance, the data should be compromised if and only if all N channels are compromised. In other words, partial security breaches are not allowed. Typically, this security constraint is satisfied using an (N, N) secret sharing scheme. See, for example, A. Shamir, "How to Share a Secret," Communications of the ACM, Vol. 22, 612-13 (1979), incorporated by reference herein. Generally, (N, N) secret sharing schemes distribute the secret (i.e., the data) to N participants. However, a perfect secret sharing scheme requires that each share of the secret is as large as the secret itself. Thus, the total number bits to be transmitted using a perfect (N, N) secret sharing scheme is N times the length in bits of the compressed data. This increase in the number of bits to be transmitted may prove to be too costly from the point of view of bandwidth utilization.

To improve the protection of the data from a partial security breach, without achieving perfect secret sharing, one possible method is to (i) transform the data using an invertible transform, (ii) break the transformed data into N parts, and then (iii) compress and encrypt the N parts independently before transmission. The main drawback of this method is that the amount of information about the data obtained by the attacker as a result of breaking each cipher is still significant. For example, if the transform is an invertible Fourier transform, with each broken cipher, the attacker will acquire information about the data in the transform (frequency) domain.

A need therefore exists for improved methods and apparatus for distributing data over N communication channels (or storing data into N destinations).

SUMMARY OF HE INVENTION

Generally, methods and apparatus are provided for secure distribution and storage of data using N channels. According to one aspect of the invention, an input data sequence, X, is distributed using a plurality, N, of channels. The input data sequence, X, is split into N subsequences; and the N subsequences are encoded into N bit streams using a set of Slepian-Wolf codes with N separate encoders and a joint decoder. The Slepian-Wolf codes can be selected to ensure a computational complexity to obtain a portion of the input data sequence grows exponentially with respect to a length of the input data sequence unless all of the N bit streams are compromised. The N bit streams are then transmitted or stored. At the receiver, the N bit streams can optionally be combined into the input data sequence.

The Slepian-Wolf codes can also be selected to ensure that the N subsequences are fully decoded if all N bit streams are available. The N subsequences comprise data $X_1, X_2, \ldots X_N$ having lengths $L_1, L_2, \ldots L_N$, respectively, and the Slepian-Wolf codes encode the data $X_1, X_2, \ldots X_N$ into N bit streams at rates of $R_1, R_2, \ldots R_N$. The Slepian-Wolf codes can be selected to ensure that (i) $0 \leq (R_1 + R_2 + \cdots + R_N)/N - H(X)$ is substantially minimized under a condition that X can be fully decoded, where $H(X)$ denotes an entropy rate of X; and/or (ii) $0 \leq H(X|T) - R_1$ is substantially maximized under a condition X can be fully decoded, where $T_i$ denotes an arbitrary strict subset of $\{X_1, \ldots X_{i-1}, X_{i+1}, \ldots X_N\}$, and $H(X_i|T_i)$ denotes a conditional entropy rate of $X_i$ given $T_i$.

The Slepian-Wolf codes can be selected to encode the N subsequences into the N bit streams whose rates are subject to constraints arising from one or more of user input, transmission channel conditions, and storage requirements. The input data sequence can optionally be preprocessed using an invertible transform prior to the splitting step.

According to another aspect of the invention, an input data sequence, X, is distributed using a plurality, N, of channels. The input data sequence, X, is compressed using a lossless data compressing techniques; splitting the compressed input data sequence into N subsequences; and the N subsequences are distributed.

A more complete understanding of the present invention, as well as further features and advantages of the present invention, will be obtained by reference to the following detailed description and drawings.

DETAILED DESCRIPTION OF PREFERRED EMBODIMENTS

Figure 1:
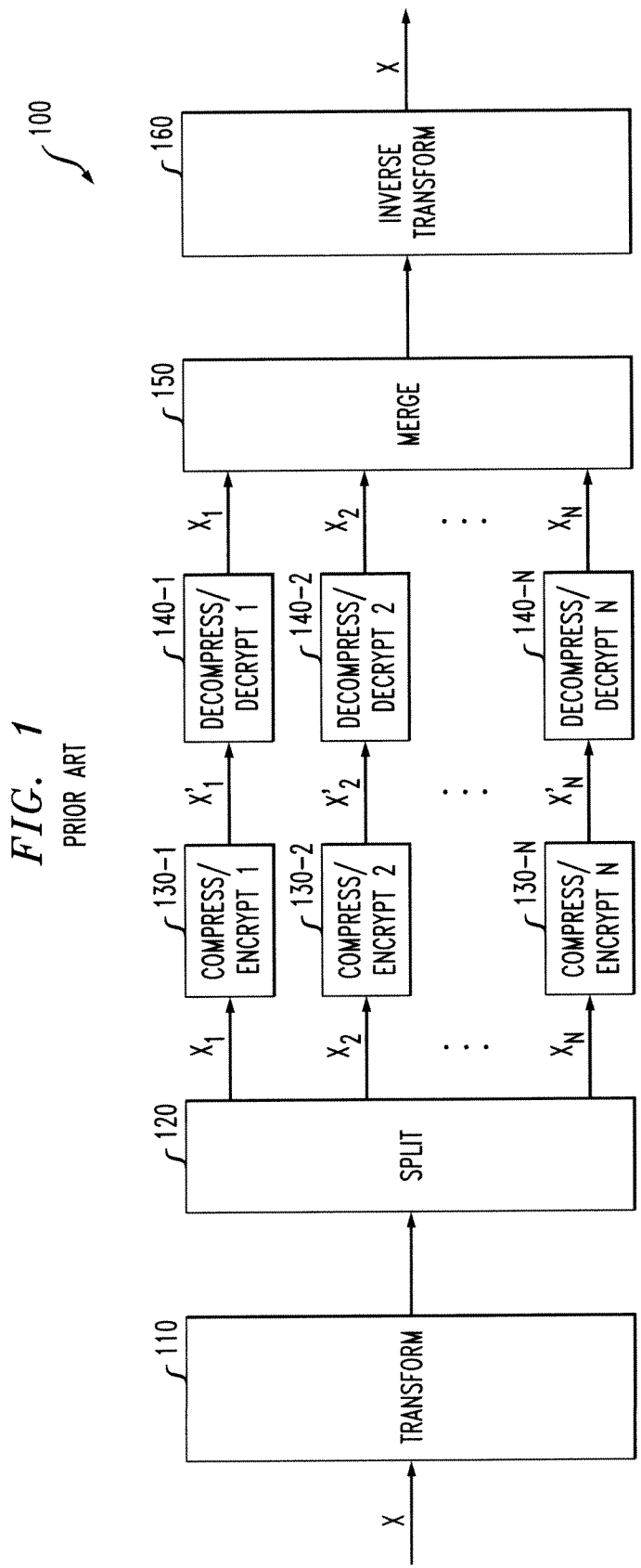
FIG. 1 illustrates a conventional (N, N) secret sharing scheme 100 that employs encryption to protect a data sequence.

The present invention provides methods and apparatuses for distributing data over N communication channels (or storing data into N destinations). One aspect of the present invention encodes a data sequence into N bit streams, from which the data can be fully recovered. The N bit streams are then distributed over N channels or stored into N destinations. The data is compressed because the total number of bits in the N bit streams is typically smaller than that used to describe the data before encoding. The distribution and/or storage of the data is secure because no portion of the data is compromised without significant computational effort. In other words, the computational complexity needed to obtain any portion of the data grows exponentially with respect to the length of the data, unless all N bit streams are compromised. As used herein, the terms "transmission of data over N channels" and "distribution of data over N channels" and variations of those terms shall include the storage of data over N channels.

In one embodiment, the present invention distributes data over N communication channels (or stores data into N destinations) while satisfying the following constraints:

1. the bandwidth (or storage) resources are efficiently utilized (e.g., the total number of bits transmitted is close to the length in bits of the compressed data); and 2. the data is protected from a partial security breach (e.g., no portion of the data is compromised without significant computational effort; i.e., the computational complexity needed to obtain any portion of the data grows exponentially with respect to the length of data, unless all N bit streams are compromised.

According to one aspect of the invention, discussed further below, a Slepian-Wolf code is employed with N separate encoders to encode the data X into N bit streams as follows: X is first broken into N parts $X_1, X_2, X_N$ with equal length L, and then the N encoders of the Slepian-Wolf code are used to encode $X_1, X_2, \ldots, X_N$ into N bit streams $B_1, B_2, \ldots, B_N$ with rates (in bits per input symbol) $R_1, R_2, \ldots R_N$, respectively, such that:

1. X can be fully recovered from the N bit streams;
2. $(R_1+R_2+\ldots+R_N)/N$ is close to the entropy rate H(X) of X; and
3. $R_i < H(X_i)$ for all i=1, 2, ... N, where $H(X_i)$ denotes the entropy rate of $X_i$.

The first condition (i.e., X can be fully recovered from the N bit streams) can be satisfied if $$(R_1+R_2+\ldots+R_N)/N > H(X);$$

The second condition is directly related to the purpose of achieving compression. Finally, the third condition implies that even if $B_i$ is compromised, the attacker cannot recover $X_i$ from $B_i$ without a computational complexity that is exponential with respect to $L_i$.

According to another aspect of the invention, discussed further below, the data is first compressed and then the compressed data is split into N bit streams for transmission or storage. If the compression is nearly perfect (i.e., the compression achieves the theoretical limit given by the entropy rate of the data), then the bit streams representing the compressed data are substantially completely random. Thus, as long as at least one bit stream is not compromised, the attacker still needs an exponentially large computational complexity to compromise the data completely. If the attacker knows how the data is split and transmitted, the attacker can try to focus his/her efforts in breaking a sequential part of the compressed data by observing all N communication channels for a short period of time. This could potentially lead to a partial security breach if the compression algorithm used is not carefully designed and engineered to prevent successful decoding of a sequential part of the compressed data.

(N, N) Secret Sharing Schemes

FIG. 1 illustrates a conventional (N, N) secret sharing scheme 100 that employs encryption to protect a data sequence, X. As shown in FIG. 1, on the transmit side, the exemplary (N, N) secret sharing scheme comprises a transform 110 that transforms the data using, for example, an invertible transform, a splitter 120 to break the transformed data into N parts, and N optional compression/encryption blocks 130-1 through 130-N to compress and/or encrypt the N parts independently before transmission.

On the receive side, the exemplary (N, N) secret sharing scheme 100 comprises N decompression/decryption blocks 140-1 through 140-N to decompress and/or decrypt the transmitted N parts, a merge block 150 to combine the outputs of the N optional decompression/decryption blocks 140-1 through 140-N, and an inverse transform block 160 that performs the inverse of the transform that was applied by block 110.

Slepian-Wolf Encoding

Generally, the Slepian-Wolf theorem deals with the lossless compression of two or more correlated data streams. See, D. Slepian and J. K. Wolf, "Noiseless Coding of Correlated Information Sources," IEEE Trans. on Information Theory, Vol. 19, 471-80. (1973), incorporated by reference herein. Typically, each of the correlated streams is encoded separately and the compressed data from all these encoders are jointly decoded by a single decoder. Generally, compared to an encoder that assumes the data streams are independent, the separate encoders can achieve better compression rates by exploiting the fact that the data streams are correlated.

Figure 2:
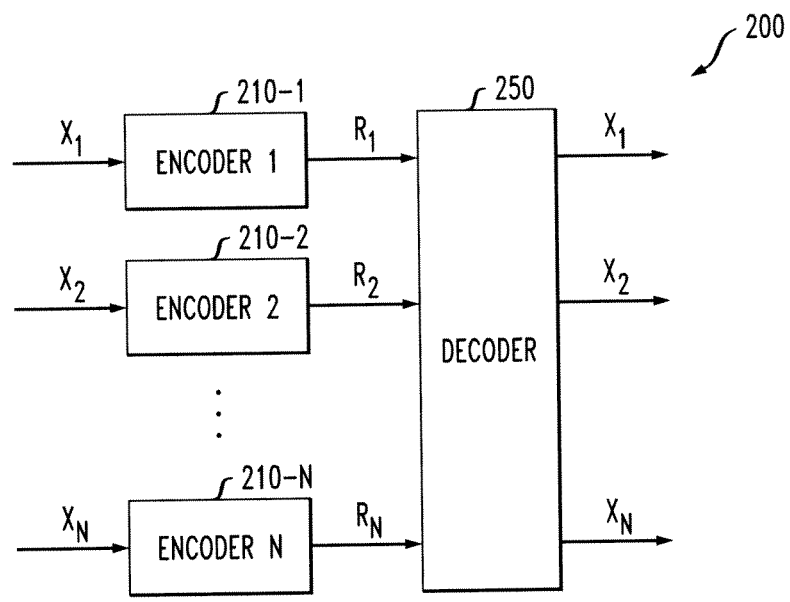
FIG. 2 illustrates a conventional Slepian-Wolf encoding system.

FIG. 2 illustrates a conventional Slepian-Wolf encoding system 200. As shown in FIG. 2, the exemplary Slepian-Wolf encoding system 200 comprises N encoders 210-1 through 210-N and a joint decoder 250. The Slepian-Wolf encoding system 200 compresses N data sequences $X_1, X_2, \ldots X_N$, independently into N bit streams. The N bit streams have rates, in bits per symbol, of $R_1, R_2, \ldots, R_N$, respectively. The joint decoder 250 jointly decodes the N bit streams into the N data sequences $X_1, 2, \ldots X_N$. Each encoder 210 can independently employ the same or different data rates, $R_i$. It is noted that:

$$R_i \geq H(X_i|X_1 \ldots X_{i-1}X_{i+1} \ldots X_N), \text{ and}$$

$$R_1+R_2+\ldots R_N \geq H(X_1X_2 \ldots X_N),$$

where H(X) denotes the entropy rate of X, $T_i$ denotes an arbitrary strict subset of $\{X_1, \ldots X_{i-1}, X_{i+1}, \ldots X_N\}$, and $H(X_i|T_i)$ denotes the conditional entropy rate of $X_i$ given $T_i$.

Secure Distribution/Storage Using Slepian-Wolf Codes

As previously indicated, aspects of the present invention distribute data over N communication channels (or store data into N destinations). According to one aspect of the invention, a Slepian-Wolf code is employed with N separate encoders to encode the data X into N bit streams as follows: the input data X is first broken into N parts $X_1, X_2, \ldots$, with equal length L, and then the N encoders of the Slepian-Wolf code are used to encode $X_1, X_2, \ldots, X_N$ into N bit streams $B_1, B_2, \ldots, B_N$ with rates (in bits per input symbol) $R_1, R_2, \ldots, R_N$, respectively.

The compressed N bit streams $B_1, B_2, \ldots, B_N$ from the N encoders are jointly decoded by a single decoder.

Figure 3:
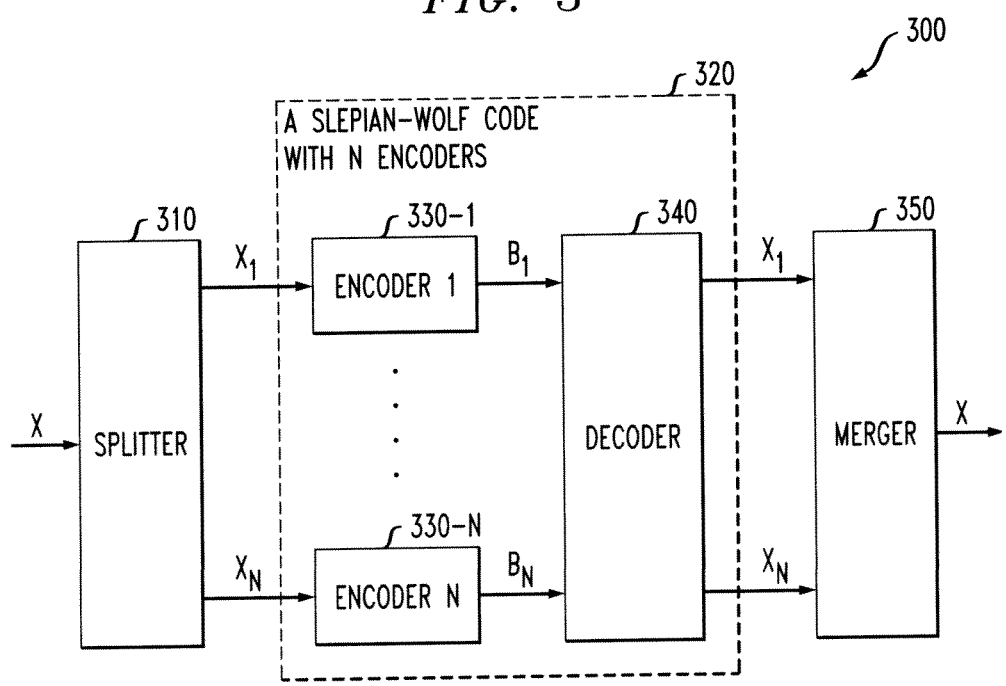
FIG. 3 illustrates a secure data distribution/storage system that incorporates a Slepian-Wolf encoding system in accordance with an embodiment of the present invention.

FIG. 3 illustrates a secure data distribution/storage system 300 that incorporates a Slepian-Wolf encoding system in accordance with an embodiment of the present invention. Generally, the secure data distribution system 300 employs a Slepian-Wolf code with N encoders to encode data X into N bit streams.

As shown in FIG. 3, the secure data distribution/storage system 300 comprises a splitter 310, a Slepian-Wolf encoding system 320 and a merger 350. The exemplary Slepian-Wolf encoding system 320 comprises N encoders 330-1 through 330-N and a joint decoder 340 that operate in a similar manner to the corresponding components of FIG. 2.

As shown in FIG. 3, the input data X is split by the splitter 310 into N parts $X_1, X_2, \ldots X_N$ with equal length L. The N encoders 330-1 through 330-N encode $X_1, X_2, \ldots X_N$ into N bit streams $B_1, B_2, \ldots, B_N$ with rates (in bits per input symbol) $R_1, R_2, \ldots, R_N$, respectively. The compressed N bit streams $B_1, B_2, \ldots B_N$ from the N encoders 330-1 through 330-N are jointly decoded by the single joint decoder 340. The merge block 350 combines the decoded outputs $X_1, X_2, \ldots, X_N$ to reproduce the input data X. The merge block 350 reverses the process of the splitter 310 by merging the N subsequences into a single data sequence.

Figure 4:
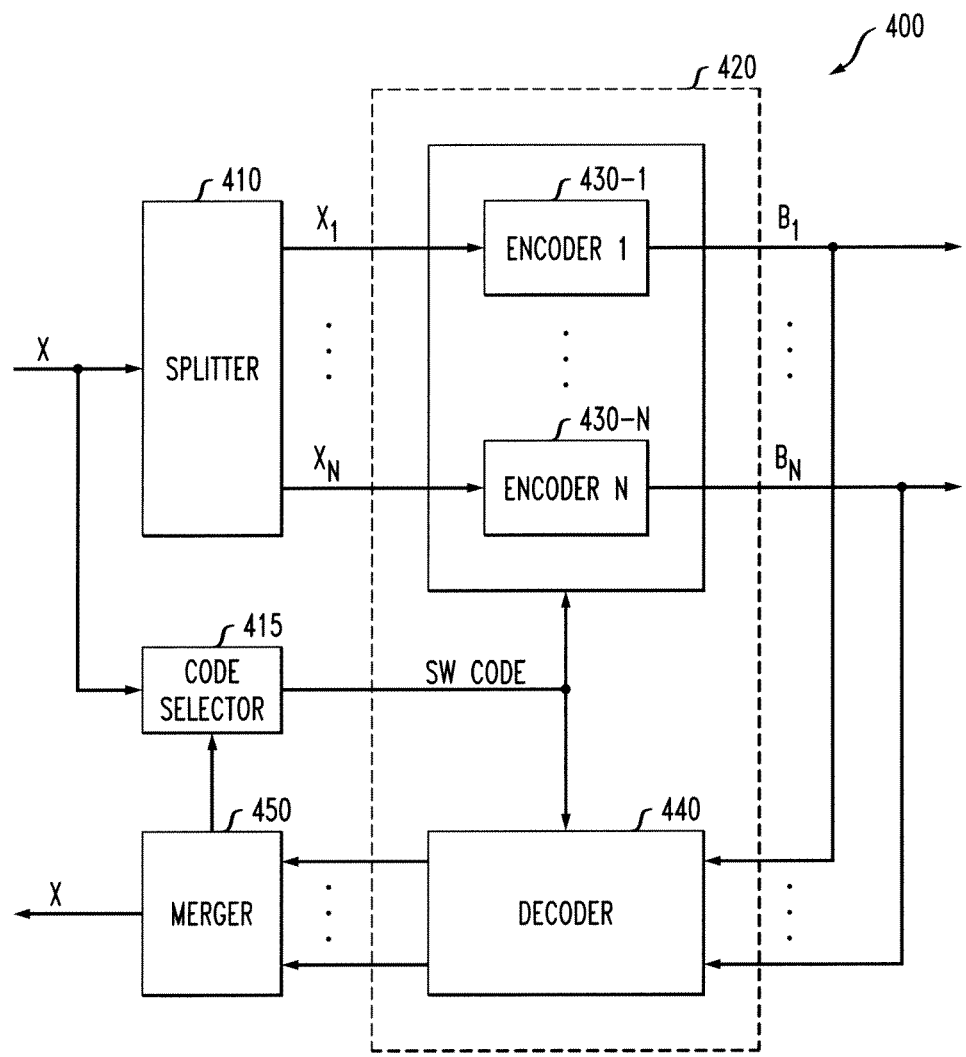
FIG. 4 illustrates a secure data distribution/storage system that incorporates a Slepian-Wolf encoding system in accordance with an alternate embodiment of the present invention.

FIG. 4 illustrates a secure data distribution/storage system 400 that incorporates a Slepian-Wolf encoding system in accordance with an alternate embodiment of the present invention. As shown in FIG. 4, the exemplary secure data distribution/storage system 400 comprises a splitter 410, a Slepian-Wolf code selector 415, a Slepian-Wolf encoding system 420 and a merger 450. The exemplary Slepian-Wolf encoding system 420 comprises N encoders 430-1 through 430-N and a joint decoder 440 that operate in a similar manner to the corresponding components of FIG. 2.

As shown in FIG. 4, the input data X is split by the splitter 410 into N parts $X_1, X_2, \ldots, X_N$ with equal length L. The code selector 415 processes the input data X, in a manner discussed further below, to select the appropriate Slepian-Wolf code to encode the output of the splitter 410 into N bit streams so that the N subsequences can be fully decoded if all N bit streams are available, and none of the N subsequences can be decoded if at least one of the N bit streams is missing.

Using the selected Slepian-Wolf code (SW Code), the N encoders 430 encode $X_1, X_2, \ldots, X_N$ into N bit streams $B_1, B_N$ with rates (in bits per input symbol) $R_1, R_2, \ldots, R_N$, respectively. The compressed N bit streams $B_1, B_2, B_N$ from the N encoders 430 are jointly decoded by the single joint decoder 440, again using the selected Slepian-Wolf code. The merge block 450 combines the decoded outputs $X_1, X_2, \ldots, X_N$ to reproduce the input data X.

Selection of Slepian-Wolf Code

Consider the following example. Suppose that X is a binary data sequence having a length L that is to be distributed (or stored). Taking X as the input, the splitter 410 breaks the input data X into N subsequences $X_1, X_2, \ldots, X_N$ with equal length L. In parallel, the code selector 415 selects a Slepian-Wolf code with N encoders 430 from a library of codes for X. Then, each $X_i$, $i=1, 2, \ldots, N$, is encoded by one encoder 430 of the selected Slepian-Wolf code into a bit stream $B_i$ at rate $R_i$.

For the purpose of efficient utilization of bandwidth (or storage) resources, the code selector 415 tries to find a Slepian-Wolf code such that:

$$0 \leq (R_1+R_2 \ldots R_N)/N - H(X) \qquad \text{Constraint (1)}$$

is substantially minimized under the condition that X can be fully decoded, where H(X) denotes the entropy rate of X.

For the purpose of protecting data from partial security breach, the code selector 415 tries to find a Slepian-Wolf code such that:

$$0 \leq H(X_i|T_i) - R_i \qquad \text{Constraint (2)}$$

is substantially maximized again under the condition X can be fully decoded, where $T_i$ denotes an arbitrary strict subset of $\{X_1, \ldots X_{i-1}, X_{i+1}, \ldots X_N\}$, and $H(X_i|T_i)$ denotes the conditional entropy rate of $X_i$ given $T_i$. Suppose that Constraint (2) holds. Then, if $B_i$ is compromised, the computational complexity required for the attacker to recover $X_i$ from $B_i$ grows exponentially with respect to L (search among a set $S_i$ whose cardinality $|S_i|$ satisfies $$\log|S_i| \sim L[H(X_i) - R_i],$$

where the logarithm is to base 2). Indeed, as long as there exists a $B_j$ that remains secure, the computational complexity required for the attacker to recover any $X_i$, $i \neq j$, from $B_1, \ldots B_{j-1}, B_{j+1}, \ldots B_N$ still grows exponentially with respect to L.

Note that a Slepian-Wolf code satisfying Constraints (1) and (2) simultaneously exists if:

$$H(X_i|T_i) > H(X_i|X_1, \ldots, X_{i-1}, X_{i+1}, \ldots, X_N)$$

holds for all $i=1, 2, \ldots, N$, and all choices of $T_i$, where $H(X_i|X_1, \ldots, X_{i-1}, X_{i+1}, \ldots, X_N)$ denotes the conditional entropy rate of $X_i$ given $X_1, \ldots, X_{i-1}, X_{i+1}, \ldots, X_N$.

Secure Distribution/Storage Using Splitting of Compressed Data

As previously indicated, another aspect of the invention initially compresses the input data and then the compressed data is split into N bit streams for secure transmission or storage. The present invention recognizes that if the compression is nearly perfect (i.e., the compression substantially achieves the theoretical limit given by the entropy rate of the data), then the bit streams representing the compressed data are substantially completely random. Thus, as long as at least one bit stream is not compromised, the attacker still needs an exponentially large computational complexity to compromise the data completely. If the attacker knows how the data is split and transmitted, the attacker can try to focus his/her efforts in breaking a sequential part of the compressed data by observing all N communication channels for a short period of time. This could potentially lead to a partial security breach if the compression algorithm used is not carefully designed and engineered to prevent successful decoding of a sequential part of the compressed data.

Figure 5:
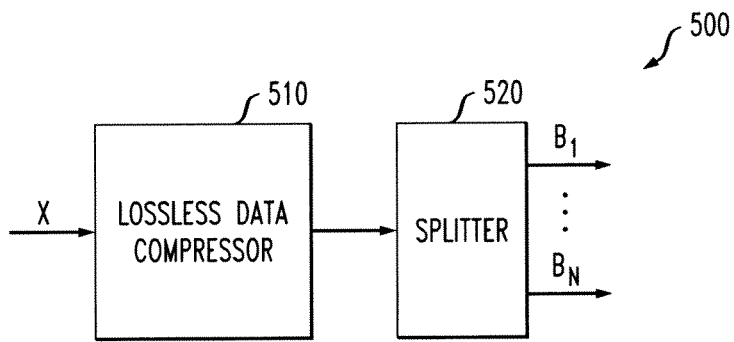
FIG. 5 illustrates a secure data distribution/storage system that uses traditional lossless data compression in accordance with an alternate embodiment of the present invention.

FIG. 5 illustrates a secure data distribution/storage system 500 that uses traditional lossless data compression in accordance with an alternate embodiment of the present invention. As shown in FIG. 5, the secure data distribution/storage system 500 comprises a lossless data compressor 510 and a splitter 520. Thus, the secure data distribution/storage system 500 compresses the input data at the lossless data compressor 510 and then the compressed data is split by the splitter 520 into N bit streams for secure transmission or storage.

As long as at least one bit stream is not compromised, an exponentially large computational complexity is required to compromise the data completely.

There are a number of suitable lossless compression techniques, such as Huffman coding and Lamp-Ziv coding techniques.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 6:
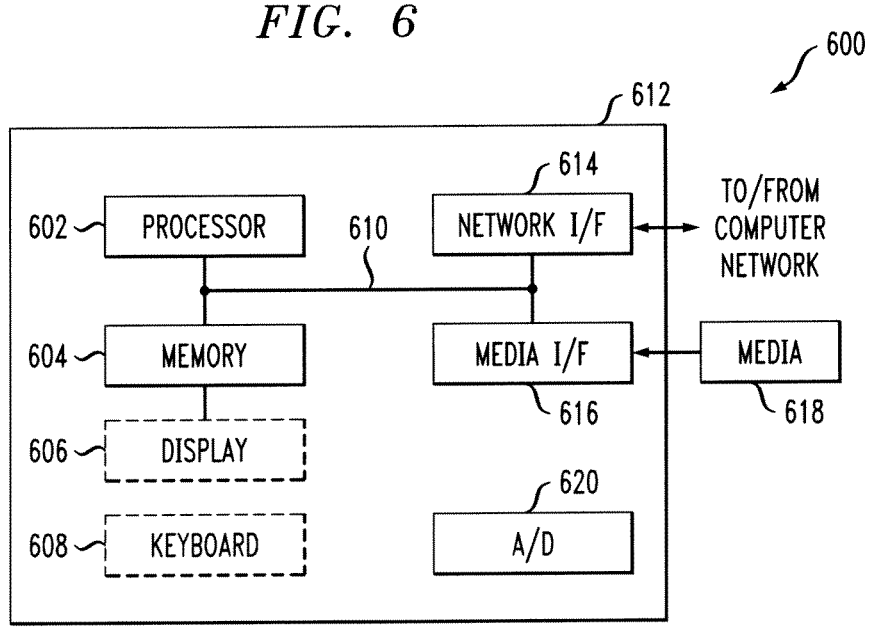
FIG. 6 depicts a computer system 600 that may be useful in implementing one or more aspects and/or elements of the present invention.

One or more embodiments can make use of software running on a general purpose computer or workstation. FIG. 6 depicts a computer system 600 that may be useful in implementing one or more aspects and/or elements of the present invention. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example. RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Analog-to-digital converter(s) 620 may be provided to receive analog input, such as analog video feed, and to digitize same. Such converter(s) may be interconnected with system bus 610.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, hulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 618 is anon-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the FIGS. illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Method steps described herein may be tied, for example, to a general purpose computer programmed to carry out such steps, or to hardware for carrying out such steps, as described herein. Further, method steps described herein, including, for example, obtaining data streams and encoding the streams, may also be tied to physical sensors, such as cameras or microphones, from whence the data streams are obtained.

It should be noted that any of the methods described herein can include an additional step of providing a system comprising distinct software modules embodied on a computer readable storage medium. The method steps can then be carried out using the distinct software modules and/or sub-modules of the system, as described above, executing on one or more hardware processors 602. In some cases, specialized hardware may be employed to implement one or more of the functions described here. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for distributing an input data sequence, X, using a plurality, N, of channels, comprising:
   splitting said input data sequence, X, into N subsequences;
   encoding said N subsequences into N bit streams using a set of Slepian-Wolf codes with N separate encoders and a joint decoder, wherein said Slepian-Wolf codes are selected to ensure a computational complexity to obtain a portion of said input data sequence grows exponentially with respect to a length of said input data sequence unless all of said N bit streams are compromised; and
   distributing said N bit streams using said N channels.

2. The method of claim 1, further comprising the step of combining said N bit streams into said input data sequence.

3. The method of claim 1, wherein said Slepian-Wolf codes are selected to ensure that the N subsequences are fully decoded if all N bit streams are available.

4. The method of claim 1, wherein said distributing step comprises one or more of transmitting said N bit streams and storing said N bit streams in a storage medium.

5. The method of claim 1, wherein said N channels comprise one or more of temporarily and spatially distributed destinations.

6. The method of claim 1, wherein said N subsequences comprise data $X_1, X_2, \ldots, X_N$ having lengths $L_1, L_2, \ldots L_N$, respectively, and wherein said Slepian-Wolf codes encode said data $X_1, X_2, \ldots, X_N$ into N bit streams at rates of $R_1, R_2, \ldots R_N$.

7. The method of claim 1, wherein said Slepian-Wolf codes are selected to ensure that $0 \leq (R_1+R_2+ \ldots +R_N)/N-H(X)$ is substantially minimized under a condition that X can be fully decoded, where H(X) denotes an entropy rate of X.

8. The method of claim 1, wherein said Slepian-Wolf codes are selected to ensure that $0 \leq H(X_i|T_i)-R_i$ is substantially maximized under a condition X can be fully decoded, where $T_i$ denotes an arbitrary strict subset of $\{X_1, \ldots X_{i-1}, X_{i+1}, \ldots X_N\}$, and $H(X_i|T_i)$ denotes a conditional entropy rate of $X_i$ given $T_i$.

9. The method of claim 1, wherein the said Slepian-Wolf codes are implemented as low-density parity-check (LDPC) codes.

10. The method of claim 1, wherein said Slepian-Wolf codes are selected to encode said N subsequences into said N bit streams whose rates are subject to constraints arising from one or more of user input, transmission channel conditions, and storage requirements.

11. The method of claim 1, further comprising the step of processing said input data sequence using an invertible transform prior to said splitting step.

12. A method for distributing an input data sequence, X, using a plurality, N, of channels, comprising the steps of:
compressing said input data sequence, X, using a lossless data compressing techniques;
splitting said compressed input data sequence into N subsequences; and
distributing said N subsequences using said N channels, wherein said lossless data compressing technique is selected to ensure a computational complexity to obtain a portion of said input data sequence grows exponentially with respect to a length of said input data sequence unless all of said N channels are compromised, and wherein at least one of said steps of said method are performed by at least one hardware device.

13. The method of claim 12, further comprising the step of combining said N subsequences into said input data sequence.

14. The method of claim 12, wherein said distributing step comprises one or more of transmitting said N subsequences and storing said N subsequences in a storage medium.

15. The method of claim 12, wherein said N channels comprise one or more of temporarily and spatially distributed destinations.

16. The method of claim 12, further comprising the step of processing said input data sequence using an invertible transform prior to said splitting step.

17. A computer program product for distributing an input data sequence, X, using a plurality, N, of channels, said computer program product comprising a non-transitory tangible computer readable recordable storage medium having computer readable program code embodied therewith, said computer readable program code comprising:
computer readable program code configured to split said input data sequence, X, into N subsequences;
computer readable program code configured to encode said N subsequences into N bit streams using a set of Slepian-Wolf codes with N separate encoders and a joint decoder, wherein said Slepian-Wolf codes are selected to ensure a computational complexity to obtain a portion of said input data sequence grows exponentially with respect to a length of said input data sequence unless all of said N bit streams are compromised; and
computer readable program code configured to distribute said N bit streams using said N channels.

18. The computer program product of claim 17, wherein said Slepian-Wolf codes are selected to ensure that the N subsequences are fully decoded if all N bit streams are available.

19. The computer program product of claim 17, wherein said distribution comprises one or more of transmitting said N bit streams and storing said N bit streams in a storage medium.

20. An apparatus for distributing an input data sequence, X, using a plurality, N, of channels, comprising:
a splitter that splits the input data sequence into N subsequences;
a set of Slepian-Wolf codes with N separate encoders and one joint decoder for encoding said N subsequences into N bit streams; and
a code selector that selects said Slepian-Wolf codes to ensure a computational complexity to obtain a portion of said input data sequence grows exponentially with respect to a length of said input data sequence unless all of said N bit streams are compromised.

21. The apparatus of claim 20, wherein said Slepian-Wolf codes are selected to ensure that the N subsequences are fully decoded if all N bit streams are available.

22. The apparatus of claim 20, wherein said N channels comprise one or more of temporarily and spatially distributed destinations.

* * * * *